US010396836B2

(12) United States Patent
Hell

(10) Patent No.: US 10,396,836 B2
(45) Date of Patent: Aug. 27, 2019

(54) ELECTRONIC CIRCUIT WITH A RINGING SUPPRESSION CIRCUIT, NETWORK, AND METHOD FOR OPERATING THE ELECTRONIC CIRCUIT

(71) Applicant: Infineon Technologies AG, Neubiberg (DE)

(72) Inventor: Magnus-Maria Hell, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/941,534

(22) Filed: Mar. 30, 2018

(65) Prior Publication Data

US 2018/0287642 A1  Oct. 4, 2018

(30) Foreign Application Priority Data

Apr. 3, 2017 (DE) .................. 10 2017 107 149

(51) Int. Cl.
| H04L 25/03 | (2006.01) |
| H04B 1/04 | (2006.01) |
| H03K 5/1252 | (2006.01) |
| H04L 12/40 | (2006.01) |

(52) U.S. Cl.
CPC ......... *H04B 1/0475* (2013.01); *H03K 5/1252* (2013.01); *H04L 12/40* (2013.01); *H04L 12/40169* (2013.01); *H04L 2012/40215* (2013.01)

(58) Field of Classification Search
CPC ................. H03F 1/3247; H04L 27/368; H04L 25/03343; H04L 25/0278
USPC ............... 375/296, 295, 346; 327/50, 384
See application file for complete search history.

(56) References Cited

U.S. PATENT DOCUMENTS

| 2011/0285424 A1* | 11/2011 | Suzuki | ............... H03K 17/0822 |
| | | | 327/50 |
| 2012/0287681 A1* | 11/2012 | Wahledow | ............... H02M 1/38 |
| | | | 363/21.04 |
| 2013/0099849 A1* | 4/2013 | Suzuki | ............. H03K 19/00361 |
| | | | 327/384 |

(Continued)

FOREIGN PATENT DOCUMENTS

| JP | 07273624 A | 10/1995 |
| JP | 2005236915 A | 9/2005 |

OTHER PUBLICATIONS

Office Action, in the German language, from counterpart German Application No. 102017107149.0, dated Dec. 12, 2017, 7 pp.

*Primary Examiner* — Khai Tran
(74) *Attorney, Agent, or Firm* — Shumaker & Sieffert, P.A.

(57) ABSTRACT

An electronic circuit includes a transmitter with a first output configured to be connected to a first signal line of a signal bus, a second output configured to be connected to a second signal line of a signal bus, and an input configured to receive an input signal; and a ringing suppression circuit with a third output configured to be connected to the first signal line, and a fourth output configured to be connected to the second signal line. The transmitter is configured to operate in one of a first operating state or a second operating state dependent on the input signal. The ringing suppression circuit is configured to detect a change from the first operating state to the second operating state of the transmitter, and to operate in a ringing suppression mode for a predefined time period in response to detecting the change.

25 Claims, 7 Drawing Sheets

(56) References Cited

U.S. PATENT DOCUMENTS

2018/0041361 A1\* 2/2018 Kishigami .......... H04L 12/4625
2018/0248542 A1\* 8/2018 Mori ........................ H03K 5/08

\* cited by examiner

ELECTRONIC CIRCUIT WITH A RINGING SUPPRESSION CIRCUIT, NETWORK, AND METHOD FOR OPERATING THE ELECTRONIC CIRCUIT

This Application claims priority to German Application Number 102017107149.0, filed on Apr. 3, 2017, the entire content of which is incorporated herein by reference.

This disclosure in general relates to an electronic circuit configured to be coupled to a signal bus, in particular a CAN (Controller Area Network) bus.

Signal busses, such as CAN busses, are widely used as communication busses, for example, in automotive or industrial applications. A plurality of devices can be connected to one communication bus which makes it possible for the devices to communicate with each other. Each of the devices includes a communication interface that can be connected to the bus and provides for the communication between the device where it is included and other devices connected to the bus. Examples of the devices include actors, such as actors for actuating lights or electric motors, or sensors.

A CAN bus, for example, includes two signal lines which are usually referred to as CANH and CANL. The bus can have two different states, dominant, which is when a voltage between the signal lines is higher than a certain threshold, and recessive, which is when the voltage between the signal lines is essentially zero. In a CAN network, which is a network with a CAN bus and two or more devices connected to the bus, one device can transmit data to the other devices by changing the bus state in accordance with the data to be transmitted.

During data transmission, that is, when one device frequently changes the bus state, ringing may occur. Ringing may include oscillations of the voltage between the bus lines, in particular, when the bus is in the recessive state.

There is a need to suppress or at least reduce ringing on the signal bus.

One example relates to an electronic circuit. The electronic circuit includes a transmitter with a first output configured to be connected to a first signal line of a signal bus, a second output configured to be connected to a second signal line of a signal bus, and an input configured to receive an input signal; and a ringing suppression circuit with a third output configured to be connected to the first signal line, and a fourth output configured to be connected to the second signal line. The transmitter is configured to operate in one of a first operating state or a second operating state dependent on the input signal. The ringing suppression circuit is configured to detect a change from the first operating state to the second operating state of the transmitter, and operate in a ringing suppression mode for a predefined first time period at least based on detecting a change from the first operating state to the second operating state of the transmitter.

Another example relates to network. The network includes a signal bus with a first signal line, a second signal line, and a bus resistor connected between the first signal line and the second signal line, and an electronic circuit with a transmitter and a ringing suppression circuit. The transmitter includes a first output configured to be connected to a first signal line of the signal bus, a second output configured to be connected to the second signal line of a signal bus, and an input configured to receive an input signal. The ringing suppression circuit includes a third output configured to be connected to the first signal line, and a fourth output configured to be connected to the second signal line. The transmitter is configured to operate in one of a first operating state or a second operating state dependent on the input signal. The ringing suppression circuit is configured to detect a change from the first operating state to the second operating state of the transmitter, and operate in a ringing suppression mode for a predefined first time period at least based on detecting a change from the first operating state to the second operating state of the transmitter.

Another example relates to a method. The method includes, by a ringing suppression circuit connected to a first signal line and a second signal line of a signal bus, detecting a change from a first operating state to a second operating state of a transmitter connected to the first signal line and the second signal and receiving an input signal. The method further includes operating in a ringing suppression mode for a predefined first time period by the ringing suppression circuit at least based on detecting the change from the first operating state to the second operating state of the transmitter.

Examples are explained below with reference to the drawings. The drawings serve to illustrate certain principles, so that only aspects necessary for understanding these principles are illustrated. The drawings are not to scale. In the drawings the same reference characters denote like features.

FIG. 1 schematically illustrates an electronic circuit configured to be coupled to a signal bus;

In the following detailed description, reference is made to the accompanying drawings. The drawings form a part of the description and for the purpose of illustration show examples of how the invention may be used and implemented. It is to be understood that the features of the various embodiments described herein may be combined with each other, unless specifically noted otherwise.

Figure 1:
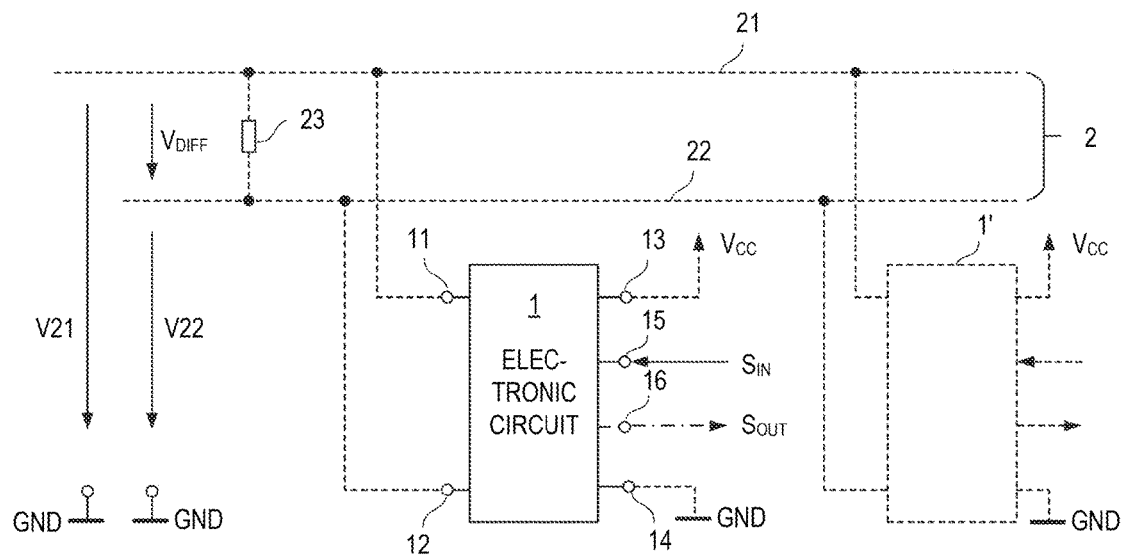

FIG. 1 schematically illustrates one example of an electronic circuit 1 that is configured to be coupled to a signal bus and communicate via the signal bus. For the purpose of illustration, one example of a signal bus 2 is also illustrated (in dashed lines) in FIG. 1. This signal bus 2 includes a first signal line 21, a second signal line 22, and a resistor 23 connected between the first signal line 21 and the second signal line 22. According to one example, the signal bus 2 is a CAN (Controller Area Network) bus. In this example, the first signal line 21 may also be referred to as CANH line and the second signal line 22 may also be referred to as CANL line.

Referring to FIG. 1, the electronic circuit 1 includes a first output 11 configured to be connected to the first signal line 21, a second output 12 configured to be connected to the second signal line 22, a first supply input 13 configured to receive a first supply potential $V_{CC}$, a second supply input 14 configured to receive a second supply potential GND, and a signal input 15 configured to receive an input signal $S_{IN}$. The electronic circuit 1 is configured to operate in a first output state or a second output state dependent on the input signal $S_{IN}$ in order to transmit data (information) via the signal bus 2 to one or more other electronic circuits connected to the same signal bus. One such other electronic circuit 1' is illustrated in dashed lines in FIG. 1. According to one example, the electronic circuit 1 is not only configured to transmit the data via the signal bus 2 but, in the second output state, is also configured to receive data via the signal bus 2 from one or more other electronic circuits connected to the signal bus 2. In this example, the electronic circuit further includes a signal output 16 (illustrated in dashed and dotted lines in FIG. 1) where an output signal $S_{OUT}$ is available. This output signal $S_{OUT}$ is dependent on data received by the electronic circuit 1 via the signal bus 2.

The electronic circuit 1 acts as a communication interface between an electronic device (not shown in FIG. 1) that provides the input signal $S_{IN}$ and, optionally, receives the output signal $S_{OUT}$ and one or more other devices connected to the signal bus 2 via one or more other electronic circuits each acting as a communication interface. Examples of those electronic devices include, but are not restricted to sensors, or actors or drivers for loads, such as electric motors, lights, or the like.

Figure 2:
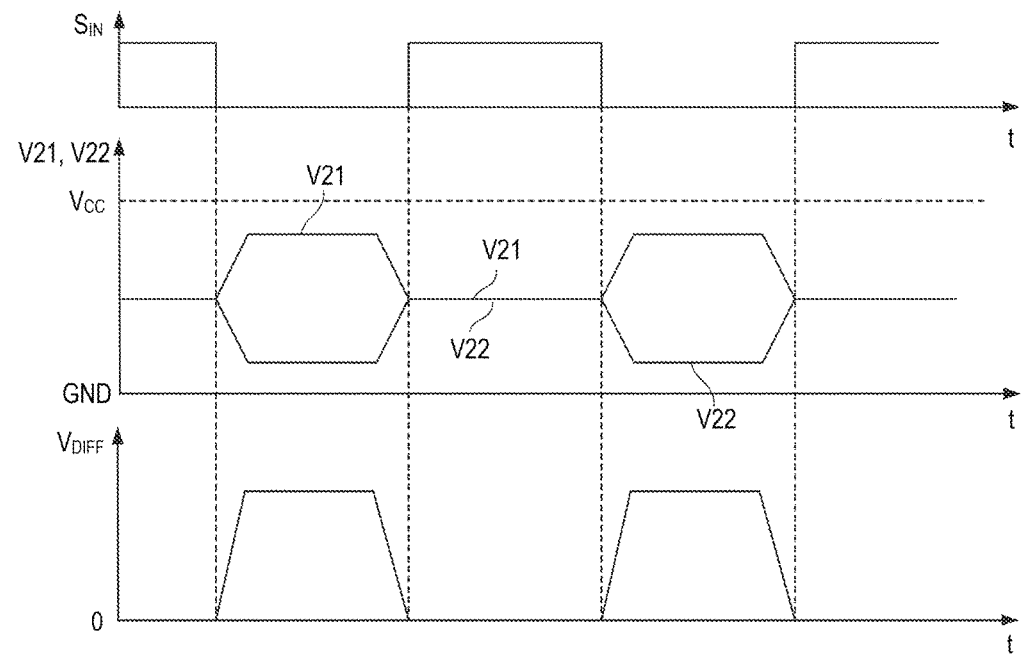
FIG. 2 shows timing diagrams that illustrate one way of operation of the electronic circuit shown in FIG. 1.

FIG. 2 shows timing diagrams that illustrate one way of operation of the electronic circuit 1 shown in FIG. 1. These timing diagrams illustrate example waveforms of the input signal $S_{IN}$; a first voltage V21 between the first signal line 21 and the second supply input 14, where the second supply potential GND is available; a second voltage V22 between the second signal line 22 and the second supply input 14; and a voltage $V_{DIFF}$ between the first signal line 21 and the second signal line 22, wherein is the first voltage V21 minus the second voltage V22 ($V_{DIFF}$=V21−V22). The voltage $V_{DIFF}$ is also referred to as bus voltage in the following. According to one example, the input signal $S_{IN}$ can have a first signal level or a second signal level, wherein the electronic circuit 1 operates in the first output state when the input signal $S_{IN}$ has the first signal level and in the second output state if the input signal $S_{IN}$ has the second signal level. Just for the purpose of illustration, the first signal level is a low signal level and the second signal level is a high signal level in the example shown in FIG. 2. Referring to FIG. 2, in the second operating state of the electronic circuit 1, the first voltage V21 and the second voltage V22 are substantially equal, so that the bus voltage $V_{DIFF}$ is essentially zero. This second output state of the electronic circuit 1 and the corresponding state of the signals bus 21, 22 may also be referred to as recessive state. In the first output state, the first voltage V21 and the second voltage V22 are such that the voltage $V_{DIFF}$ between the first signal line 21 and the second signal 22 is different from zero. This second output state of the electronic circuit 1 and the corresponding state of the signal bus 21, 22 may also be referred to as dominant state.

Just for the purpose of illustration, the waveforms shown in FIG. 2 are based on the assumption that in the time period illustrated in FIG. 2 only the electronic circuit 1 that receives the input signal $S_{IN}$ defines the state of the signal bus 2, so that the state of the signal bus 2 follows the output state of the electronic circuit 1. That is, during this time period other electronic circuits connected to the same signal bus 2 are in a recessive state. It should be noted that in a network of the type shown in FIG. 1 that includes the signal bus 2 and two or more electronic circuits 1, 1' connected to the signal bus scenarios may occur in which two or more electronic circuits are in a dominant state at the same time and where one of these electronic circuits enters the recessive state while one or more electronic circuits are still in the dominant state. In this case, the bus is maintained in the dominant state after the one of the electronic circuits has entered the recessive state. In particular, this scenario may occur in an arbitration phase in which several electronic circuits communicate with each other in order to determine which of the electronic circuits is allowed to send data via the signal bus. After such arbitration phase and during a communication phase there is only one electronic circuit that changes its output state between the first output state and the second output state dependent on an input signal in order to transmit data via the signal bus, while the other electronic circuits are in the second output state (recessive state) and "listen" to the data transmitted via the signal bus by the one electronic circuit.

Figure 3:
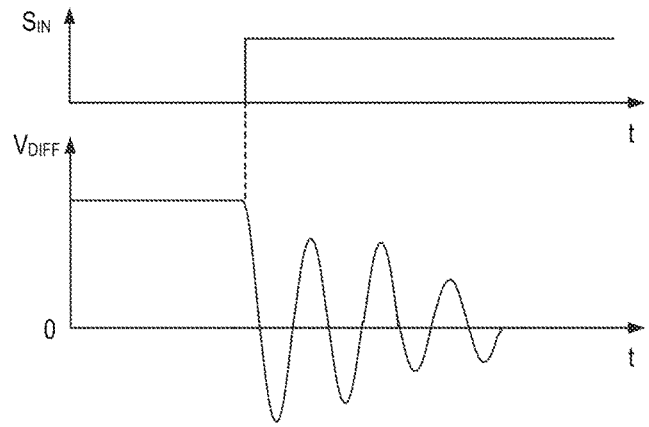
FIG. 3 show timing diagrams that illustrate ringing that may occur on the signal bus.

During a transmission of data of one electronic circuit, such as electronic circuit 1 shown in FIG. 1, ringing may occur on the signal bus 2. In order to illustrate ringing, FIG. 3 shows timing diagrams of the input signal $S_{IN}$ and the bus voltage $V_{DIFF}$ during a time period in which the input signal $S_{IN}$ changes its signal level from the first level to the second level, so that the output state of the electronic circuit 1 changes from the first output state (dominant state) to the second output state (recessive state). Referring to FIG. 3, ringing includes that the bus voltage $V_{DIFF}$ does not steadily decrease to zero when the output state changes from the first state to the second state, but includes oscillations. These oscillations may result from parasitic inductances and parasitic capacitances of the signal bus and the electronic circuit 1 and/or bus lines that are not correctly terminated. As these oscillations may negatively affect the communication via the signal bus it is desirable to suppress, or at least reduce these oscillations. Examples of an electronic circuit 1 configured to suppress or at least reduce these oscillations are explained in the following.

Figure 4A:
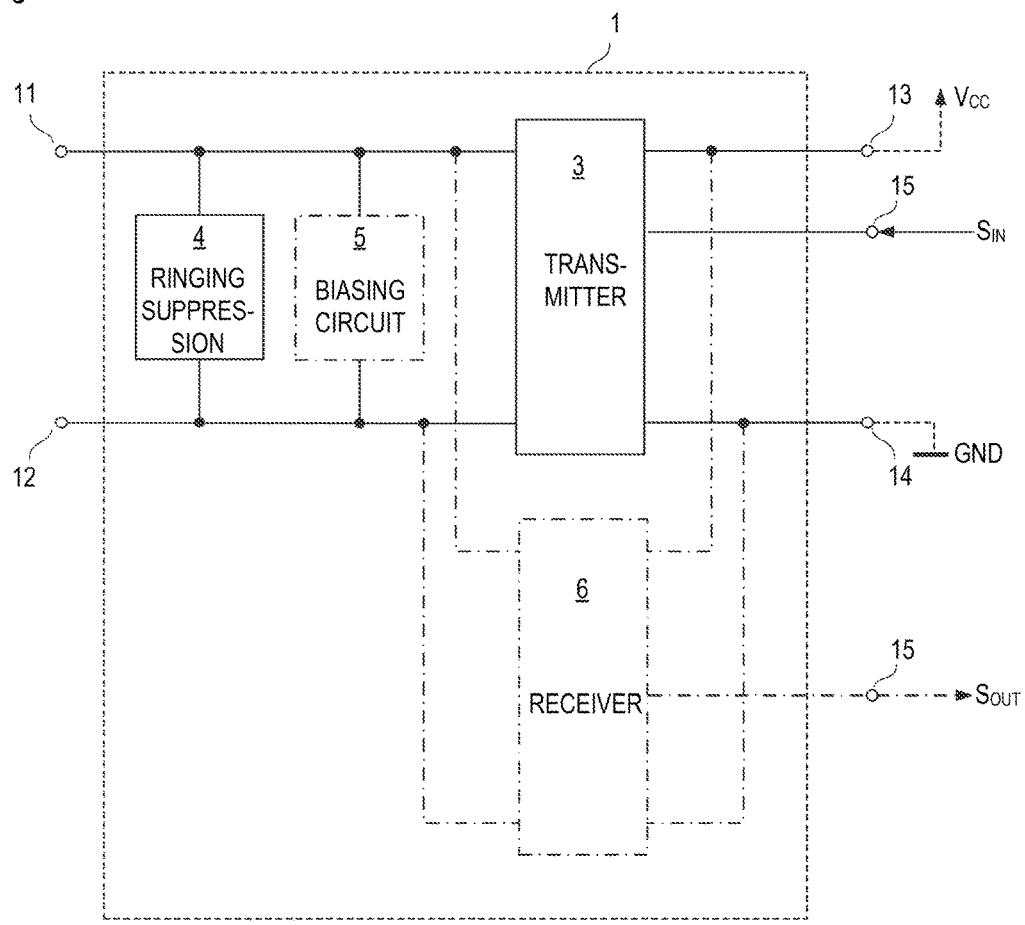
FIGS. 4A and 4B show two different examples of an electronic circuit that includes a transmitter and a ringing suppression circuit.

FIG. 4A shows a block diagram of one example of the electronic circuit configured to suppress or reduce ringing on the signal bus 2. Referring to FIG. 4A, the electronic circuit 1 includes a transmitter 3 connected to the signal input 15 of the electronic circuit 1 and configured to receive the input signal $S_{IN}$. The transmitter 3 further includes a first output connected to the first output 11 of the electronic circuit, a second output connected to the second output 12 of the electronic circuit, a first supply input connected to the first supply input 13 of the electronic circuit, and a second supply input connected to the second supply input 14 of the electronic circuit. The output state of the electronic circuit 1 is defined by an operating state of the transmitter 3 based on the input signal $S_{IN}$ received by the transmitter 3. One example of the transmitter 3 is explained herein further below. Referring to FIG. 4A, the electronic circuit 1 further includes a ringing suppression circuit 4 with a third output that is connected to the first output 11 of the electronic circuit 1 and a fourth output that is connected to the second output 12 of the electronic circuit. Optionally, the electronic circuit 1 includes a biasing circuit 5 connected between the first output 11 and the second output 12.

In the example shown in FIG. 4A, the transmitter 3 and the ringing suppression circuit 4 are connected to the signal bus 2 via the same circuit nodes, which are the first and second output nodes 11, 12. In this example, the electronic circuit 1 may be implemented as an integrated circuit and arranged in an integrated circuit package, for example, a PG-TSON package or a PG-DSO package. The inputs and outputs shown in FIG. 4 may then be implemented as pins of the integrated circuit package.

However, connecting the transmitter 3 and the ringing suppression circuit 4 to the signal bus via the same circuit nodes (such as the first and second output nodes 11, 12 shown in FIG. 4) is only an example. According to another example shown in FIG. 4B, the transmitter 3 is connected to the first output 11 and the second output 12 and is connected to the signal bus 2 via these outputs 11, 12. In this example, the ringing suppression circuit 4 is connected to a third output 11' of the electronic circuit configured to be connected to the first signal line 21 (not shown in FIG. 4B) and a fourth output 12' of the electronic circuit configured to be connected to the second signal line 22 (not shown in FIG. 4B). The third output 11' may be connected to the first signal line 21 at a position spaced apart from the first output, and the fourth output 12' may be connected to the second signal line 22 at a position spaced apart from the second output 12. Further, the transmitter 3 and the optional biasing circuit 5 may be implemented in a first integrated circuit and the ringing suppression circuit may be implemented in a second integrated circuit different from the first integrated circuit.

Figure 4B:
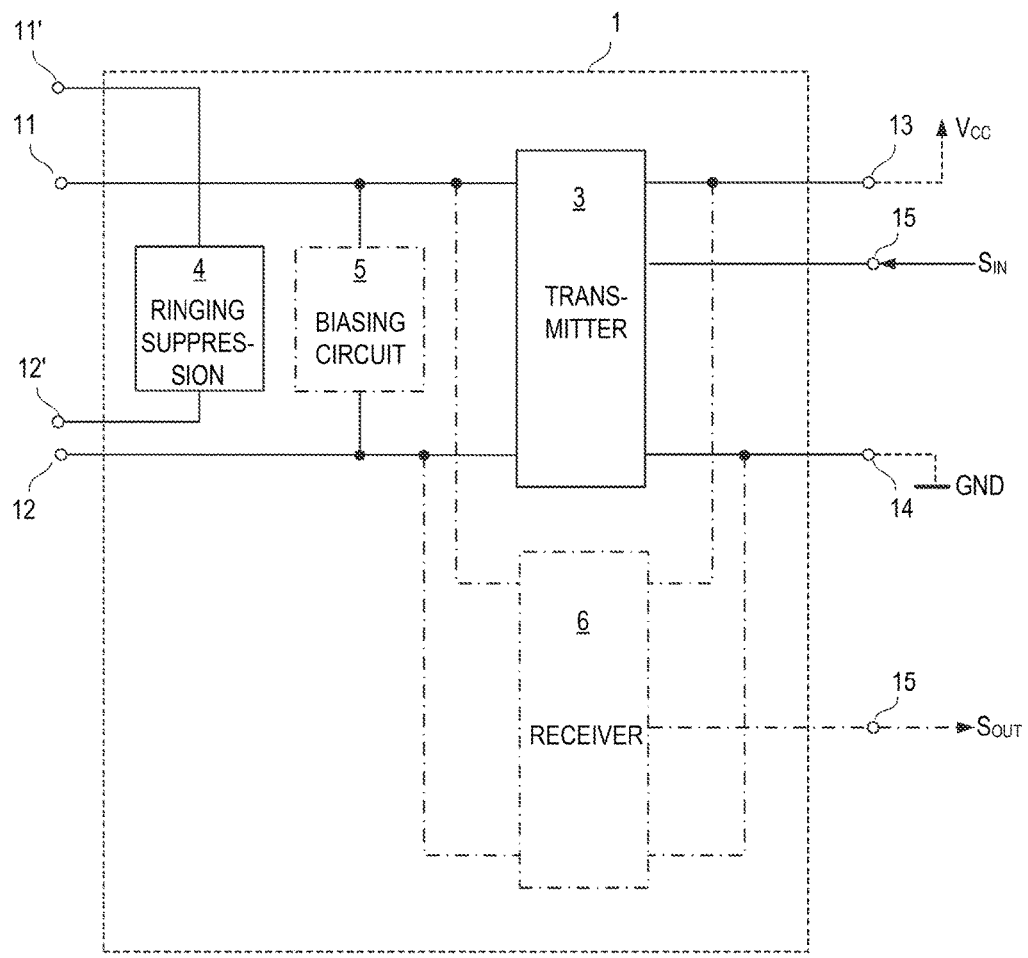

Referring to FIGS. 4A and 4B, the electronic circuit 1 optionally includes a receiver 6. This receiver 6 is connected to the first output 11 and the second output 12 (from the perspective of the receiver, the first output 11 is a first input and the second output is a second input) for receiving the bus voltage $V_{DIFF}$. Further, the receiver 6 receives a supply voltage. This supply voltage may be the same supply voltage that is received by the transmitter 3, so that the receiver may be connected to the first supply input 13 and the second supply input 14 to receive the supply voltage available between these supply input nodes 13, 14 during operation of the electronic circuit 1. This is shown in FIGS. 4A and 4B. According to another example (not shown) the receiver 6 does not receive the supply voltage available between the first supply input 13 and the second supply input 14, but a different supply voltage. The receiver 6 may generate the output signal $S_{OUT}$ such that the output signal $S_{OUT}$ has a first signal level when the bus voltage $V_{DIFF}$ indicates that the bus 2 is in the dominant state and a second signal level when the bus voltage $V_{DIFF}$ indicates that the bus 2 is in the recessive state. A dominant state of the bus as detected by the receiver may result (a) from the electronic circuit 1 or (b), when the electronic circuit 1 is in the second (recessive) operating state from another electronic circuit connected to the bus. In the first case (a), the output signal $S_{OUT}$ is a delayed version of the input signal $S_{IN}$ wherein the delay results from propagation delays in the electronic circuit 1. In this case, the output signal $S_{OUT}$ allows the device connected to electronic circuit 1 to verify whether the information included in the input signal $S_{IN}$ has been transmitted correctly via the signal bus, or whether there have been "collisions" with other electronic circuits. Such collisions may occur when two or more electronic circuits are in the dominant state at the same time.

Figure 5:
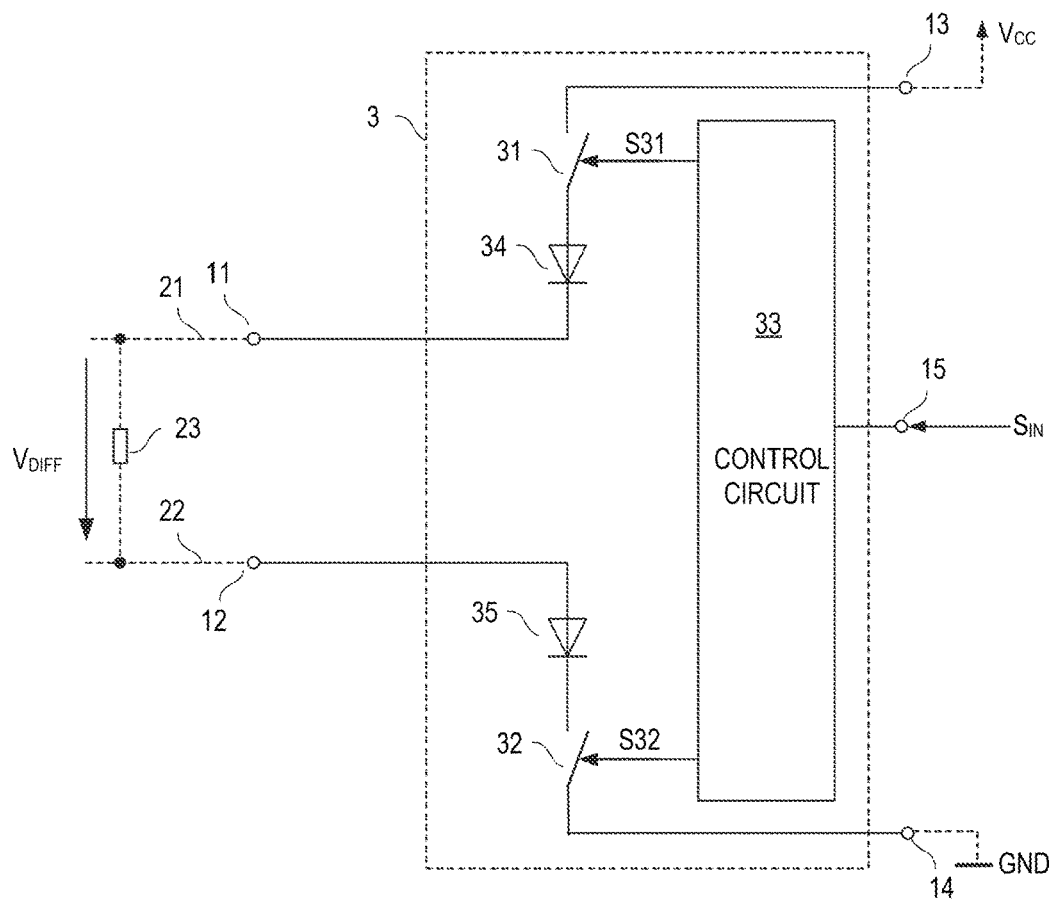
FIG. 5 shows one example of the transmitter.

FIG. 5 shows one example of the transmitter 3. In this example the transmitter 3 includes a first electronic switch 31 connected between the first supply input 13 and the first output 11, and a second electronic switch 32 connected between the second supply input 14 and the second output 12. A control circuit 33 receives the input signal $S_{IN}$ and is configured to drive the first electronic switch 31 and the second electronic switch 32 based on the input signal $S_{IN}$. The control circuit 33 drives the first electronic switch 31 and the second electronic switch 32 by generating a first drive signal S31 and a second drive signal S32. The first electronic switch 31 receives the first drive signal at a control node, and the second electronic switch 32 receives the second drive signal at a control node. The first electronic switch 31 and the second electronic switch 32 are only schematically illustrated in FIG. 5. These first and second electronic switches 31, 32 can be implemented using any type of electronic switch. Examples of electronic switches suitable for implementing the first and the second electronic switches 31, 32 include but are not restricted to, MOSFETs (Metal Oxide Semiconductor Field-Effect Transistors), IGBTs (Insulated Gate Bipolar Transistors), BJTs (Bipolar Junction Transistors), HEMTs (High Electron Mobility Transistors), or the like. The same applies to any other electronic switch implemented in the electronic circuit 1 and explained in the following.

The control circuit 33 is configured to switch on or switch off the first electronic switch 31 and the second electronic 32 dependent on the input signal $S_{IN}$. In particular, the control circuit 33 is configured to switch on the first electronic switch 31 and the second electronic switch 32 when the input signal $S_{IN}$ has a first signal level, indicating that the electronic circuit 1 is to be operated in the first operating state (dominant state), and switch off the first electronic switch 31 and the second electronic switch 32 when the input signal $S_{IN}$ has the second signal level, indicating that the electronic switch 1 is to be operated in the second operating state (recessive state). The first electronic switch 31 has an on-resistance which is an electric resistance of the first electronic switch 31 in the on-state, and the second electronic switch 32 has an on-resistance, which is an electric resistance of the second electronic switch 32 in the on-state. When the control circuit 33 switches on the first electronic switch 31 and the second electronic switch 32 there is a resistive voltage divider between the first supply input 13 and the second supply input 14 wherein this voltage divider includes the on-resistance of the first electronic switch 31, the on-resistance of the second electronic switch 31, a resistance of the bus resistor 23 that couples the first signal line 21 and the second signal line 22, and (not shown) line resistances of signal lines within the electronic circuit 1 and the signal lines 21, 22 of the signal bus 2. The bus voltage $V_{DIFF}$ is essentially the voltage across the bus resistor 23. Due to the on-resistances of the first and second electronic switch 31 and 32 the bus voltage $V_{DIFF}$, as shown in FIG. 2, is smaller than the supply voltage between the first supply input 13 and the second supply input 14. Optionally, a first diode 34 is connected in series with the first electronic switch 31 and the second diode 35 is connected in series with the second electronic switch 32. Forward voltages of these diodes 34, 35 further reduce the bus voltage $V_{DIFF}$ as compared to the supply voltage. According to one example, the supply voltage $V_{CC}$ is about 5V and, in the dominant state of the bus 2, the first voltage V21 is about 3.5 V and the second voltage V22 is about 1.5 V, so that the bus voltage $V_{DIFF}$ is about 2 V and a voltage drop in the transmitter 3 between the first supply node 13 and the first signal line 21 is about 1.5 V and between the second signal line 22 and the second supply node 14 is about 1.5 V.

When the control circuit 33 switches off the first electronic switch 31 and the second electronic switch 32 (and when no other electronic circuit coupled to the signal bus 2 is in the dominant state) the signal lines 21, 22 are floating and the bus resistor 23 causes the bus voltage $V_{DIFF}$ to decrease to zero. The optional biasing circuit 5 is configured to define the potential of the first and second signal level 21, 22 when the first and second electronic switches 31, 32 are off, that is, when the electronic circuit 1 is in the recessive state. According to one example, a resistance of the bus resistor 23 is selected from between 40 Ohm (40Ω) and 100 Ohm (100Ω), in particular between 50Ω and 70Ω. Just for the purpose of illustration, only one resistor 23 is shown in FIG. 1. This resistor 23 represents any type of resistor arrangement between the first signal line 21 and the second signal line 22. According to one example, there is only one resistor connected between the first signal line 21 and the second signal line 22. However, it is also possible to have two or more resistors connected between the first signal line 21 and the second signal line 22. These two or more resistors may be located at different positions of the signal bus 2, which may have a length of be up to several meters. The specific resistances mentioned before are the resistances of the overall resistor arrangement. If, for example, it is intended to have a resistance of 60Ω between the first signal line 21 and the second signal line 22 one resistor with a resistance of 60Ω may be used, two resistors each with a resistance of 120Ω may be used, three resistors each with a resistance of 180Ω may be used, etc.

Figure 6:
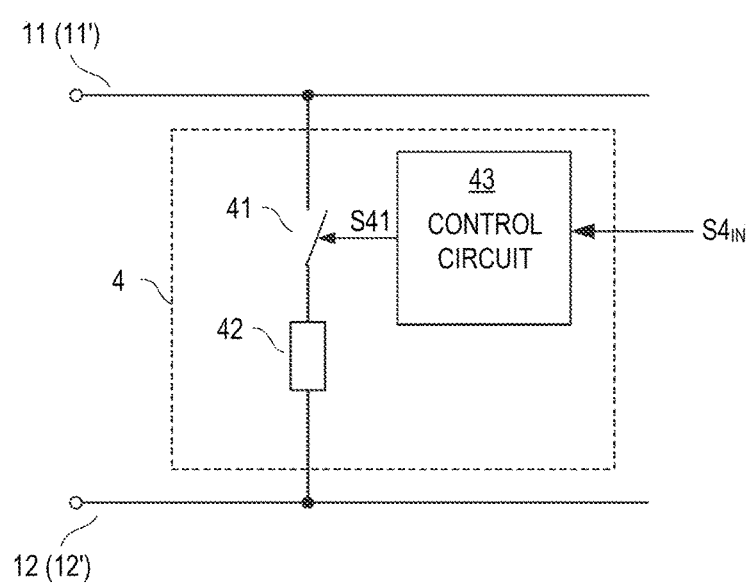
FIG. 6 shows one example of a ringing suppression circuit that includes an electronic switch, a resistor and a control circuit.

In order to suppress ringing, the ringing suppression circuit 4 is configured to detect a change from the first operating state to the second operating state of the transmitter and to operate in a ringing suppression mode for a predefined first time duration at least based on detecting such change of the operating state. "At least based on detecting such change of the operating state" means that the ringing suppression circuit operates in the ringing suppression mode only upon detecting such change of the operating state, but not necessarily operates in the ringing suppression mode each time a change of the operating state has been detected, because operating in the ringing suppression mode can be dependent on further conditions, which is explained herein further below. According to one example, the ringing suppression circuit is configured to detect the change of the operating state of the transmitter by monitoring the input signal that initiates such change of the operating state FIG. 6 shows one example of the ringing suppression circuit 4. In this example, the ringing suppression circuit 4 includes a series circuit with an electronic switch 41 and a resistor 42, wherein this series circuit is connected between the first output node 11 and a second output node 12. A control circuit 43 drives the electronic switch 41 based at least on an input signal $S4_{IN}$ that indicates if a change of the operating state of the transmitter 3 from the first operating state to the second operating state has been initiated by the input signal $S_{IN}$. This signal $S4_{IN}$ can be any signal that indicates that such change of the operating state has been initiated or that represents the operating state of the transmitter 3. According to one example, the signal $S4_{IN}$ received by the control circuit 43 is the input signal $S_{IN}$. According to another example, the signal $S4_{IN}$ is one of the drive signals S31, S32 generated by the control circuit 33 shown in FIG. 5 based on the input signal $S_{IN}$.

Figure 7:
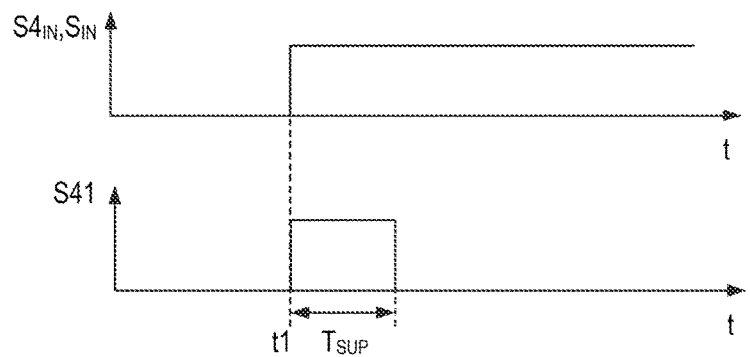
FIG. 7 shows timing diagrams that illustrate one example of how the ringing suppression circuit may operate.

In the example shown in FIG. 6, the operating state of the ringing suppression circuit 4 is defined by the control circuit based on the input signal $S4_{IN}$. The ringing suppression circuit 4 is either active, which is when the ringing suppression circuit 4 is in the ringing suppression mode, or inactive, which when the ringing suppression circuit 4 is not in the ringing suppression mode. According to one example, the control circuit 43 switches on the electronic switch 41 when the ringing suppression circuit 4 is active and switches off when the ringing suppression circuit is inactive. This is illustrated in FIG. 7 that schematically shows signal waveforms of the input signal $S4_{IN}$ received by the ringing suppression circuit 4 and the drive signal S41 generated by the control circuit 43 based on the input signal $S4_{IN}$. For the purpose of illustration, it is assumed that the input signal $S4_{IN}$ received by the ringing suppression circuit 4 is the input signal $S_{IN}$ received by the electronic circuit 1. Further, it is assumed that a change of a signal level of this input signal $S_{IN}$ from the first level (low level in FIG. 7) to the second level (high level in FIG. 7) initiates a change of the operating state of the transmitter 3 from the first operating state to the second operating state. According to one example, the drive signal S41 received by the electronic switch 41 has an on-level that switches on the electronic switch 41 or an off-level that switches off the electronic switch. Just for the purpose of illustration, the on-level is drawn as a high signal level and the off-level is drawn as a low signal level in the example shown in FIG. 7.

In example shown in FIG. 7, a signal level of the input signal $S_{IN}$ changes from the first level to the second level at a first time t1 which, in this example, is representative of the change of the transmitter 3 from the first operating state to the second operating state. In this example, the control circuit 43 switches on the electronic switch 41 beginning at the first time t1 for a predefined duration $T_{SUP}$ so that the ringing suppression circuit 4 operates in the ringing suppression for the predefined time period $T_{SUP}$ upon detecting the change of the operating state of the transmitter 3. In this example, operation of the ringing suppression circuit 4 in the ringing suppression mode is only dependent on detecting the change of the operating state and operation of the ringing suppression circuit 4 in the ringing suppression mode starts (immediately) upon detecting the change of the operating state.

When the electronic switch 41 is switched on, the ringing suppression circuit 4 electrically connects the first signal line 21 and the second signal line 22 of the signal bus via the electronic switch 41 and the resistor 42. A resistance of this resistor 42 may be in the same range as the resistance of the bus resistor 23. According to one example, a ratio R42/R23 between a resistance R23 of the bus resistor and a resistance R42 of the resistor in the ringing suppression circuit 4 is between ⅓ and 3, in particular between ½ and 2. Thus, when the ringing suppression circuit 4 is active, that is, when the electronic switch 41 is switched on, there is an electric connection with a relatively low impedance between the two signal lines 21 and 22, wherein such low impedance suppresses ringing or at least reduces ringing on the signal bus. The resistance of the resistor 42 may be selected from a range of between 50 Ohm and 200 Ohm, in particular between 100 Ohm and 150 Ohm. According to one example, the predefined time duration $T_{SUP}$ is selected from a range of between 50 nanoseconds (ns) and 10 microseconds (μs) nanoseconds, in particular between 200 nanoseconds (ns) and 1 microsecond.

In the electronic circuit 1, the ringing suppression circuit 4 is activated after a change from the first operating state to the second operating state of the transmitter 3 was detected, so that the ringing suppression circuit 4 is activated only in a time period in which ringing caused by the change of the operating state of the electronic circuit 1 may occur. Thus, there is no risk that the ringing suppression circuit 4 negatively affects a communication over the signal bus 2 during other time periods.

The time duration $T_{SUP}$ in which the ringing suppression circuit 4 is active may be referred to as suppression period. According to another example, shown in FIG. 8, the ringing suppression circuit 4 is not immediately activated when the input signal $S_{IN}$ indicates a change of the operating state. That is, the ringing suppression circuit 4 is not activated at the first time t1 when the input signal $S_{IN}$ changes from the first level to the second level, but there is a delay time TEL between the first time t1 and the time instance when the control circuit 43 activates the ringing suppression circuit 4. Like in the example shown in FIG. 7, operating the ringing suppression circuit 4 in the ringing suppression mode includes switching on the electronic switch 41 for the predefined time duration $T_{SUP}$. The delay time is selected from between 10 nanoseconds and 100 nanoseconds, for example.

Figure 8:
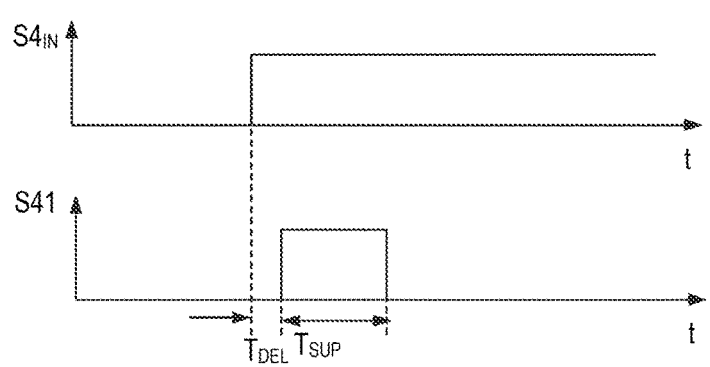
FIG. 8 shows timing diagrams that illustrate another example of how the ringing suppression circuit may operate.
Figure 9:
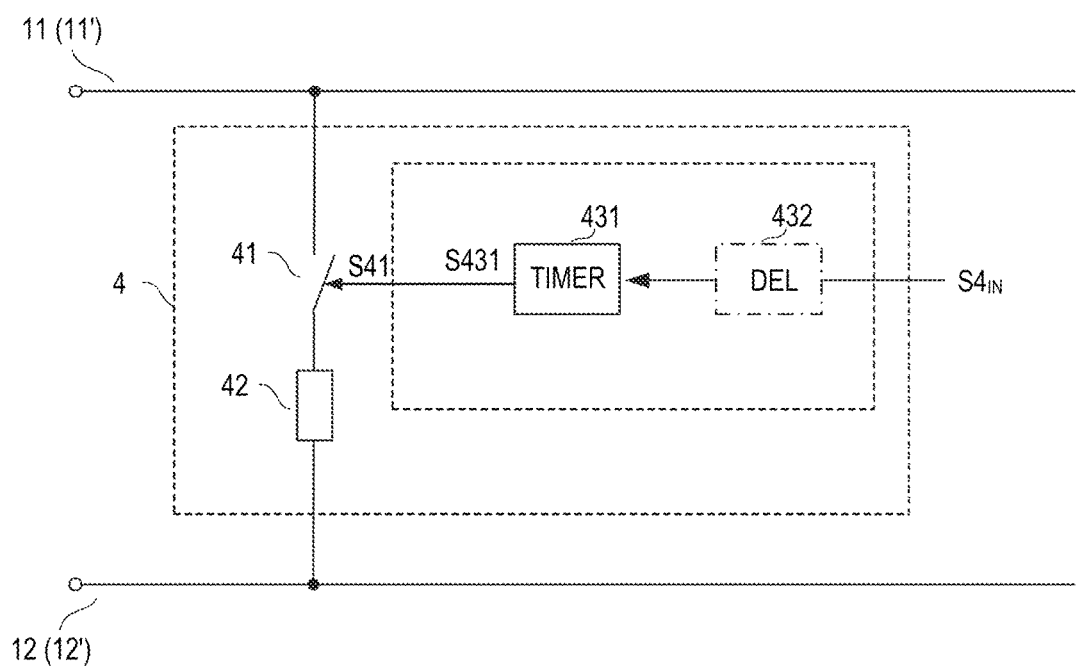
FIG. 9 shows one example of a control circuit of the ringing suppression circuit.

One example of a control circuit 43 configured to operate the electronic switch 41 in accordance with one of the examples shown in FIGS. 7 and 8 is illustrated in FIG. 9. The control circuit according to FIG. 9 includes a timer 431 that receives the input signal $S4_{IN}$. In this example, the timer 431 is configured to generate a timer output signal S431 such that it includes a signal pulse with the predefined duration $T_{SUP}$ whenever the signal level of the input signal $S4_{IN}$ changes from the first level to the second level. The timer output signal S431 drives the electronic switch 41 in this example, wherein the timer signal switches on the electronic switch 41 during the signal pulse. A signal waveform of the timer output signal S431 and the drive signal S41 generated by the control circuit 43 shown in FIG. 9 corresponds to the waveform shown in FIG. 7.

Referring to FIG. 9, optionally, a delay element 432 is connected upstream of the timer 431. This delay element 432 causes the delay time TEL illustrated in FIG. 8, that is, this delay element 432 causes the timer 431 to generate the signal pulse that switches on the electronic switch 41 for the time duration $T_{SUP}$ after the delay time TEL after the signal level of the input signal $S4_{IN}$ has changed from the first level to the second level.

Figure 10:
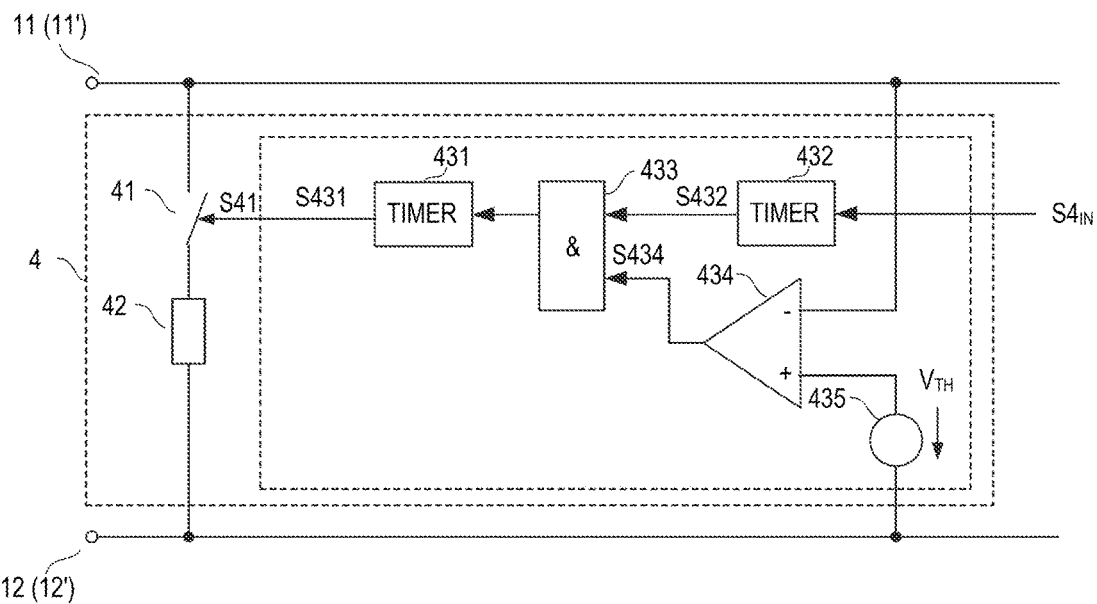
FIG. 10 shows another example of a control circuit of the ringing suppression circuit.
Figure 11:
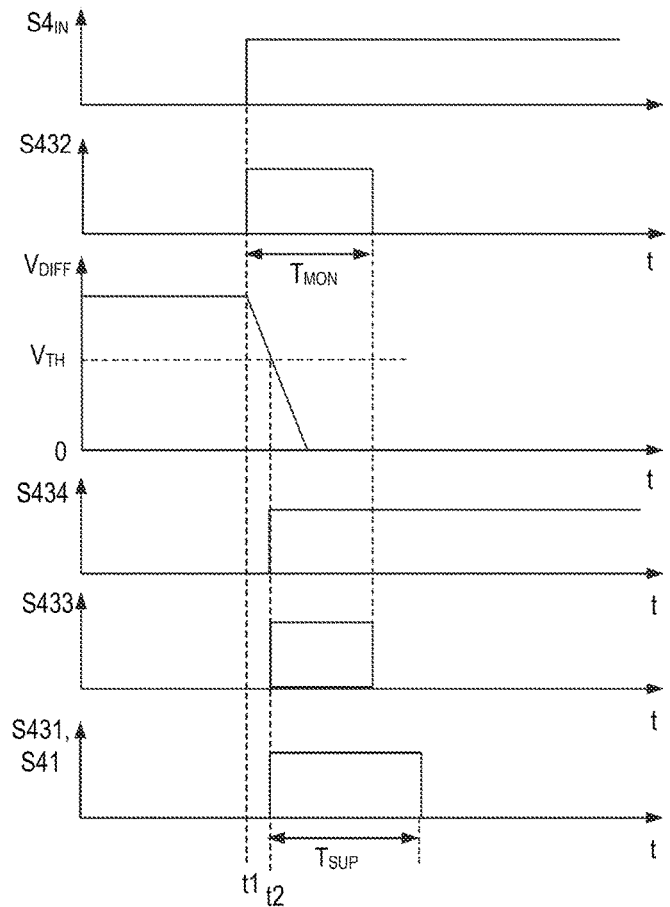
FIG. 11 shows timing diagrams that illustrate operation of a ringing suppression circuit implemented with a control circuit as shown in FIG. 10.

A control circuit 43 according to another example is shown in FIG. 10. FIG. 11 shows examples of signal waveforms that may occur in this control circuit 43. In the control circuit shown in FIG. 10, like in the example shown in FIG. 9, the ringing suppression circuit 4 operates in the ringing suppression mode based on detecting the change of the operating state of the transmitter 3, wherein detecting this change is based on monitoring the input signal $S4_{IN}$ of the ringing suppression circuit 4. Like in the examples explained before, the input signal $S4_{IN}$ may be the input signal $S_{IN}$ of the electronic circuit 1 or a signal dependent thereon or derived therefrom. In this example, however, operating the ringing suppression circuit 4 in the ringing suppression mode is not only dependent on detecting the change of the operating state of the transmitter 3, but is also dependent on another parameter. In the example shown in FIG. 10, the other parameter is the bus voltage $V_{DIFF}$ and the ringing suppression circuit 4 is operates in the ringing suppression mode for the suppression time $T_{SUP}$ only if the bus voltage $V_{DIFF}$ crosses a voltage threshold $V_{TH}$ within a monitoring time $T_{MON}$ after the change of the operating state of the transmitter 3 has been detected.

In the control circuit 43 shown in FIG. 10 the monitoring time $T_{MON}$ is defined by a further timer 432 that receives the input signal $S4_{IN}$. This further timer 432 may generate a signal pulse with duration of the monitoring time whenever the input signal $S4_{IN}$ changes its signal level such that the change of the signal level is representative of a (desired) change from the first operating state to the second operating state of the transmitter 3. In the example shown in FIG. 11, such change of the signal level of the input signal occurs at the first time t1, so that beginning with the first time t1 an output signal S432 of the further timer 432 has a signal pulse for the monitoring time $T_{MON}$. The output signal S432 of the further timer 432 is received by a logic gate 433. According to one example, the monitoring time $T_{MON}$ is selected from a range of between 100 nanoseconds (ns) and 500 nanoseconds.

Referring to FIG. 10, the logic gate 433 further receives a comparator output signal S434 from a comparator 434 that compares the bus voltage $V_{DIFF}$ with a threshold voltage $V_{TH}$ provided by a voltage source 435. An output signal S433 generated by the logic gate based on the timer output signal S432 and the comparator output signal S434 is received by the timer 431 that drives the electronic switch 41. According to one example, this timer 431 generates a signal pulse that switches on the electronic switch 41 for the suppression period $T_{SUP}$ when a predefined edge of the logic gate output signal S433 occurs. The further timer 432, the comparator 434 and the logic gate 433 are adapted to one another such that this predefined edges that starts the timer 431 and switches on the electronic switch 41 only occurs if the bus voltage $V_{DIFF}$ crosses the voltage threshold within the monitoring time $T_{MON}$. In the examples shown in FIGS. 10 and 11, "to cross the voltage threshold $V_{TH}$ by the bus voltage $V_{DIFF}$" means that the bus voltage $V_{DIFF}$ falls below the voltage threshold $V_{TH}$. In the example shown in FIG. 11, the bus voltage $V_{DIFF}$ falls below the threshold $V_{TH}$ at a second time t2 so that the comparator output signal S434 changes its signal level (from a low level to a high level in this example) at the second time t2. The second time t2 is within the monitoring period $T_{MON}$, so that the changing signal level of the comparator signal S434 together with the timer output signal S432 cause the predefined edge of the logic gate output signal S433 that switches on the electronic switch 41 via the timer 431.

Juts for the purpose of illustration the logic gate is drawn as an AND gate in FIG. 10 and the signal level of the signal pulse of the timer signal S432 is a high level. In this example, the predefined edge of the logic gate output signal S33 that activates the timer 431 is a rising edge that occurs when a rising edge of the comparator output signal S434 occurs (due to the decrease of the bus voltage $V_{DIFF}$ to below the voltage threshold $V_{TH}$).

In the ringing suppression circuit shown in FIG. 10 it is even possible that the electronic switch 41 does not switch on after the change of the operating state of the transmitter 3 from the first operating state to the second operating state was detected. This may occur, for example, when the transmitter 3 enters the second operating state (recessive state) but the signal bus is maintained in the dominant state by another electronic circuit, so that the bus voltage $V_{DIFF}$ does not fall below the threshold $V_{TH}$.

Figure 12:
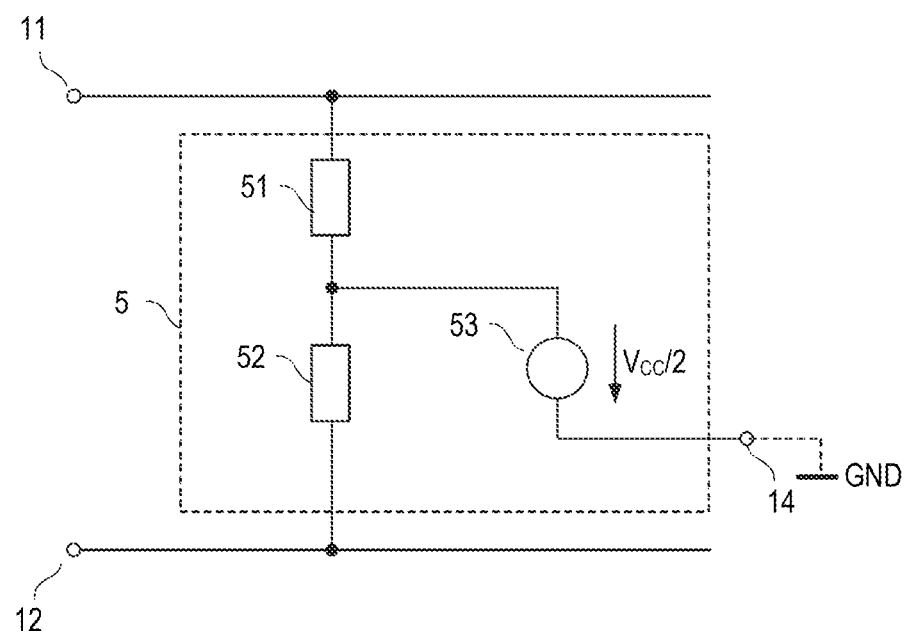
FIG. 12 shows one example of a biasing circuit configured to be coupled to the signal bus.

FIG. 12 shows one example of the optional biasing circuit 5. This biasing circuit 5 define the first and second voltages V21, V22 when each of the electronic circuits connected to the signal bus 21, 22 is in the recessive state. In the example shown in FIG. 12, the biasing circuit includes a voltage source 53 that provides a biasing voltage. According to one example, this biasing voltage is half the supply voltage, that is half the voltage available between the first supply input 13 and the second supply input 14. This voltage source 53 is connected between the second supply input 14 and a tap of a voltage divider. This voltage divider includes a first resistor 51 and a second resistor 52 connected in series between the first output 11 and the second output 12. This biasing circuit 5 biases the first and second signal line 21, 22 to a voltage that equals the voltage supplied by the voltage source 53 when each of the electronic circuits coupled to the bus 2 is in the recessive state.

The invention claimed is:

1. An electronic circuit, comprising:
   a transmitter with a first output configured to be connected to a first signal line of a signal bus, a second output configured to be connected to a second signal line of a signal bus, and an input configured to receive an input signal;
   a ringing suppression circuit with a third output configured to be connected to the first signal line, and a fourth output configured to be connected to the second signal line,
   wherein the transmitter is configured to operate in one of a first operating state or a second operating state dependent on the input signal,
   wherein the ringing suppression circuit is configured to detect a change from the first operating state to the second operating state of the transmitter, and
   wherein the ringing suppression circuit is configured to operate in a ringing suppression mode for a predefined first time period in response to detecting a change from the first operating state to the second operating state of the transmitter.

2. The electronic circuit of claim 1, wherein the ringing suppression circuit is configured to detect the change from the first operating state to the second operating state by monitoring the input signal or a signal dependent on the input signal.

3. The electronic circuit of claim 1, wherein the ringing suppression circuit is configured to operate in the ringing suppression mode for the predefined first time period upon detecting the change from the first operating state to the second operating state of the transmitter.

4. The electronic circuit of claim 1, wherein the ringing suppression circuit is configured to operate in the ringing suppression mode for the predefined first time period after a predefined delay time after detecting the change from the first operating state to the second operating state of the transmitter.

5. The electronic circuit of claim 1,
   wherein the ringing suppression circuit is further configured to monitor a bus voltage between the first signal line and the second signal line after detecting the change from the first operating state to the second operating state, and
   wherein the ringing suppression circuit is configured to operate in the ringing suppression mode for the predefined first time period upon detecting that the bus voltage crosses a predefined voltage threshold.

6. The electronic circuit of claim 5, wherein the ringing suppression circuit is configured to monitor the bus voltage for a predefined second time period after detecting the change from the first operating state to the second operating state of the transmitter and operate in the ringing suppression mode for the predefined first time period upon detecting in the second time period that the bus voltage crosses a predefined voltage threshold.

7. The electronic circuit of claim 1,
   wherein the ringing suppression circuit comprises a series circuit with an electronic switch and a resistor connected between the third output and the fourth output, and
   wherein operating in the ringing suppression mode comprises closing the electronic switch.

8. The electronic circuit of claim 7, wherein a resistance of the resistor is selected from a range of between 50 Ohm and 200 Ohm.

9. The electronic circuit of claim 1,
   wherein the transmitter is configured to couple the first output to the first supply input and to couple the second output to the second supply input when the transmitter is in the first operating state.

10. The electronic circuit of claim 1, wherein the predefined first time duration is selected from between 50 nanoseconds (ns) and 10 microseconds (ms).

11. The electronic circuit of claim 1, wherein the first output of the transmitter and the first output of the ringing suppression circuit are connected to a first output of the electronic circuit configured to be connected to the first signal line, and wherein the second output of the transmitter and the second output of the ringing suppression circuit are connected to a second output of the electronic circuit configured to be connected to the second signal line.

12. A network comprising:
    a signal bus with a first signal line, a second signal line, and a bus resistor connected between the first signal line and the second signal line; and
    an electronic circuit with a transmitter and a ringing suppression circuit,
    wherein the transmitter comprises a first output configured to be connected to a first signal line of the signal bus, a second output configured to be connected to the second signal line of a signal bus, and an input configured to receive an input signal,
    wherein the ringing suppression circuit comprises a third output configured to be connected to the first signal line, and a fourth output configured to be connected to the second signal line,
    wherein the transmitter is configured to operate in one of a first operating state or a second operating state dependent on the input signal,
    wherein the ringing suppression circuit is configured to detect a change from the first operating state to the second operating state of the transmitter, and
    wherein the ringing suppression circuit is configured to operate in a ringing suppression mode for a predefined first time period in response to detecting a change from the first operating state to the second operating state of the transmitter.

13. The network of claim 12, wherein the ringing suppression circuit comprises:
    a series circuit with an electronic switch and a resistor connected between the third output and the fourth output.

14. The network of claim 12, wherein a ratio between a resistance of the bus resistor and a resistance of the resistor in the ringing suppression circuit is between ⅓ and 3.

15. The network of claim 12, wherein the first output of the transmitter and the first output of the ringing suppression circuit are connected to a first output of the electronic circuit configured to be connected to the first signal line, and wherein the second output of the transmitter and the second output of the ringing suppression circuit are connected to a second output of the electronic circuit configured to be connected to the second signal line.

16. A method, comprising:
by a ringing suppression circuit connected to a first signal line and a second signal line of a signal bus, detecting a change from a first operating state to a second operating of a transmitter connected to the first signal line and the second signal and receiving an input signal; and
operating in a ringing suppression mode for a predefined first time period by the ringing suppression circuit in response to detecting the change from the first operating state to the second operating state of the transmitter.

17. The method of claim 16, wherein detecting the change of the operating state of the transmitter by the ringing suppression circuit comprises monitoring the input signal or a signal dependent on the input signal.

18. The method of claim 16, operating in the ringing suppression mode by the ringing suppression circuit comprises operating in the ringing suppression mode for the predefined first time period upon detecting the change from the first operating state to the second operating state of the transmitter.

19. The method of claim 16, operating in the ringing suppression mode by the ringing suppression circuit comprises operating in the ringing suppression mode for the predefined first time period after a predefined delay time after detecting the change from the first operating state to the second operating state of the transmitter.

20. The method of claim 16, further comprising:
by the ringing suppression circuit, monitoring a bus voltage between the first signal line and the second signal line after detecting the change from the first operating state to the second operating state,
wherein the ringing suppression circuit operates in the ringing suppression mode for the predefined first time period upon detecting that the bus voltage crosses a predefined voltage threshold.

21. The method of claim 20,
wherein monitoring the bus voltage comprises monitoring the bus voltage for a predefined second time period after detecting the change from the first operating state to the second operating state of the transmitter and
wherein the ringing suppression circuit operates in the ringing suppression mode for the predefined first time period upon detecting in the second time period that the bus voltage crosses a predefined voltage threshold.

22. The method of claim 16,
wherein the ringing suppression circuit comprises a series circuit with an electronic switch and a resistor connected between the third output and the fourth output, and
wherein operating in the ringing suppression mode by the ringing suppression circuit comprises closing the electronic switch.

23. The method of claim 16,
wherein in the first operating state, the couples the first output to the first supply input and the second output to the second supply input.

24. The method of claim 16, wherein the predefined first time duration is selected from between 50 nanoseconds (ns) and 10 microseconds (ms).

25. The method of claim 16, wherein transmitter and the ringing suppression circuit are connected to the signal bus via the same circuit nodes.

* * * * *